US007886956B2

(12) United States Patent
Seyama et al.

(10) Patent No.: US 7,886,956 B2
(45) Date of Patent: Feb. 15, 2011

(54) BONDING APPARATUS AND BONDING STAGE HEIGHT ADJUSTMENT METHOD FOR THE BONDING APPARATUS

(75) Inventors: Kohei Seyama, Tokyo (JP); Yutaka Kondo, Tokyo (JP); Osamu Kakutani, Tokyo (JP); Shigeru Hayata, Tokyo (JP)

(73) Assignee: Shinkawa Ltd., Tokyo (JP)

( * ) Notice: Subject to any disclaimer, the term of this patent is extended or adjusted under 35 U.S.C. 154(b) by 0 days.

(21) Appl. No.: 12/841,386

(22) Filed: Jul. 22, 2010

(65) Prior Publication Data

US 2010/0301101 A1    Dec. 2, 2010

Related U.S. Application Data

(63) Continuation of application No. PCT/JP2008/068138, filed on Oct. 6, 2008.

(30) Foreign Application Priority Data

Jan. 24, 2008    (JP)    ............................. 2008-014148

(51) Int. Cl.
*B23K 31/02*    (2006.01)
*B23K 37/00*    (2006.01)
(52) U.S. Cl. .......................... 228/105; 228/4.5; 228/9; 228/180.5
(58) Field of Classification Search ........................ None
See application file for complete search history.

(56) References Cited

U.S. PATENT DOCUMENTS 3,543,988 A * 12/1970 Kulicke, Jr. .................. 228/1.1

4,789,093 A * 12/1988 Bansemir ..................... 228/1.1
5,501,388 A *  3/1996 Takeuchi ..................... 228/1.1
5,699,951 A * 12/1997 Miyoshi ...................... 228/4.5
5,702,049 A * 12/1997 Biggs et al. .................. 228/105

(Continued)

FOREIGN PATENT DOCUMENTS

JP          53025356         3/1978

(Continued)

OTHER PUBLICATIONS

International Preliminary Report on Patentability dated May 13, 2010 for corresponding International Application PCT/JP2008/068138.

(Continued)

*Primary Examiner*—Kiley Stoner
(74) *Attorney, Agent, or Firm*—Katten Muchin Rosenman LLP

(57) ABSTRACT

A bonding apparatus includes: a reference plane; a bonding arm configured to be rotated about a rotation center that is arranged separately from the reference plane and to move a capillary attached at a tip end thereof obliquely toward and away from the reference plane; and an imaging device for optically detecting bonding positions on a semiconductor chip and/or a lead frame, in which an angle between an optical axis being heading for the imaging device from the reference plane and the reference plane is approximately equal to an angle between a motion trajectory of a tip end of the capillary and the reference plane, and thereby the bonding apparatus can have a wide bonding area with a simple mechanism as well as perform high-speed and high-accuracy bonding.

6 Claims, 13 Drawing Sheets

U.S. PATENT DOCUMENTS

| | | | |
|---|---|---|---|
| 5,735,449 A * | 4/1998 | Magni | 228/180.5 |
| 5,839,640 A * | 11/1998 | Kinnaird | 228/4.5 |
| 6,176,414 B1 | 1/2001 | Sadler | |
| 6,382,464 B1 * | 5/2002 | Uzawa | 222/64 |
| 6,398,098 B1 * | 6/2002 | Kada | 228/4.5 |
| 6,449,516 B1 * | 9/2002 | Kyomasu et al. | 700/58 |
| 6,863,206 B2 * | 3/2005 | Kyomasu et al. | 228/1.1 |
| 7,624,904 B1 * | 12/2009 | Smith | 228/4.5 |
| 7,686,204 B2 * | 3/2010 | Takahashi et al. | 228/103 |
| 7,699,209 B2 * | 4/2010 | Tei | 228/102 |
| 2001/0011669 A1 * | 8/2001 | Hayata et al. | 228/103 |
| 2001/0016062 A1 * | 8/2001 | Enokido et al. | 382/152 |
| 2001/0016786 A1 * | 8/2001 | Takahashi et al. | 700/195 |
| 2002/0008131 A1 * | 1/2002 | Hess et al. | 228/105 |
| 2003/0094481 A1 * | 5/2003 | Horie et al. | 228/180.22 |
| 2004/0245314 A1 * | 12/2004 | Vischer | 228/4.5 |
| 2005/0184127 A1 * | 8/2005 | Kakutani et al. | 228/1.1 |
| 2005/0211746 A1 * | 9/2005 | Kakutani et al. | 228/4.5 |
| 2005/0286060 A1 * | 12/2005 | Beatson et al. | 356/614 |
| 2006/0157537 A1 * | 7/2006 | Walther | 228/102 |
| 2008/0197171 A1 * | 8/2008 | Frasch et al. | 228/176 |
| 2010/0046700 A1 * | 2/2010 | Sakai et al. | 378/44 |

FOREIGN PATENT DOCUMENTS

| | | | |
|---|---|---|---|
| JP | 61-020345 A | * | 1/1986 |
| JP | 61-177732 A | * | 8/1986 |
| JP | 02-262348 A | * | 10/1990 |
| JP | 08-064629 | | 3/1996 |
| JP | 08111430 | | 4/1996 |
| JP | 09153511 | | 6/1997 |
| JP | 2000-068319 | | 3/2000 |
| JP | 3683801 | | 8/2005 |

OTHER PUBLICATIONS

International Search Report dated Nov. 25, 2008 for corresponding International Application PCT/JP2008/068138.

* cited by examiner

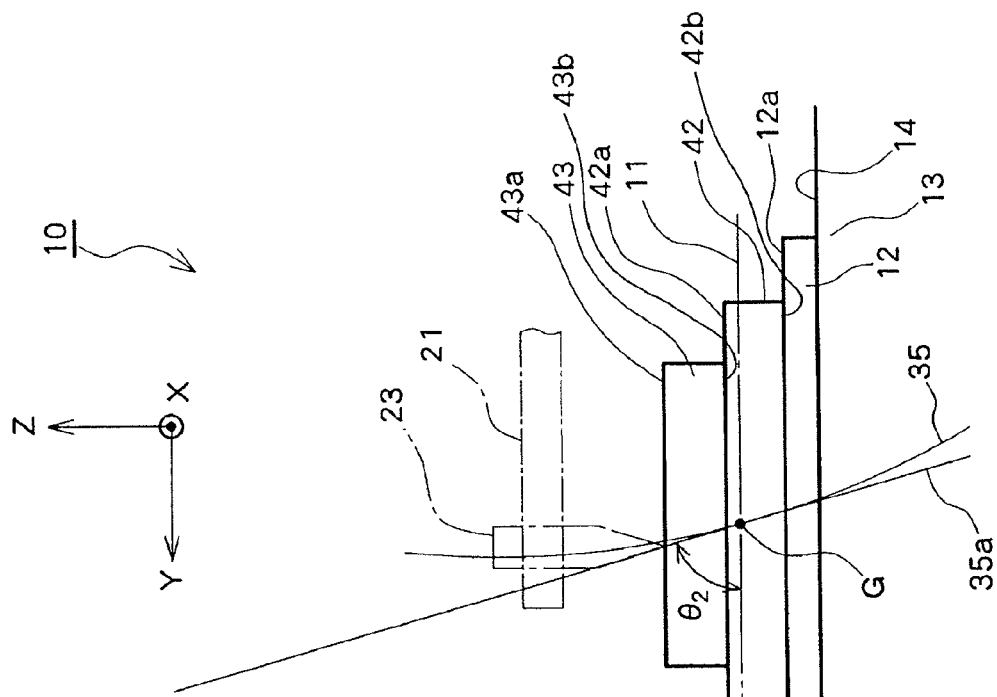
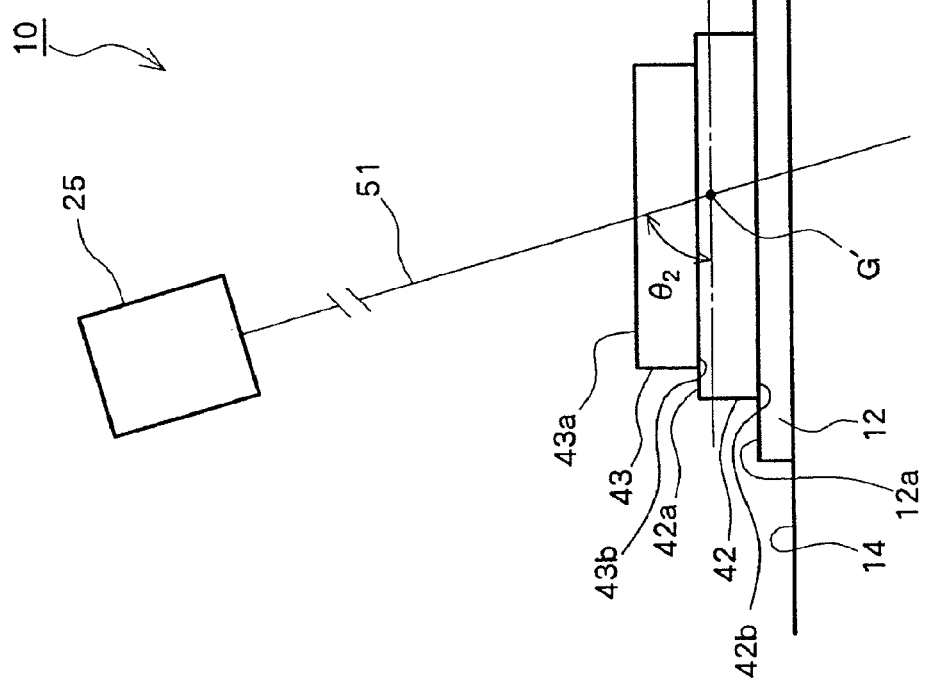
FIG. 6(a)
FIG. 6(b)

BONDING APPARATUS AND BONDING STAGE HEIGHT ADJUSTMENT METHOD FOR THE BONDING APPARATUS

BACKGROUND OF THE INVENTION

1. Field of the Invention

The present invention relates to a structure of a bonding apparatus and to a method for adjusting the height of a bonding stage in the bonding apparatus.

2. Description of the Related Art

In semiconductor manufacturing processes, wire-bonding apparatuses are used for bonding of wires to pads on a semiconductor chip mounted on a circuit board and leads on the circuit board for connection therebetween. Many wire-bonding apparatuses include a bonding arm configured to be rotated by a drive motor about a rotation center and to vertically drive a bonding tool, such as a capillary, attached at a tip end thereof and, through the operation of the bonding arm, bond and connect a wire inserted through a tip end of the bonding tool to pads and/or leads (see FIG. 1 of Japanese Patent No. 3683801, for example).

Such bonding apparatuses require positioning of the tip end of the bonding tool over pads and/or leads for bonding, for which image-based positioning methods are becoming common. Japanese Unexamined Patent Application Publication No. Sho 53-25356, for example, proposes a method in which a TV camera is arranged right over a mark on a work placed on a table, and the positional relationship between the capillary and the work is determined with the mark appearing on the monitor of the TV camera being aligned with a reference on the monitor and, based on this determination, bonding is performed. Japanese Unexamined Patent Application Publication No. Hei 8-111430 also discloses an arrangement in which a certain region on a semiconductor chip and tip end portions of leads are imaged by imaging means such as an ITV camera, the amount of displacement of an imaging target is obtained with respect to a reference coordinate (image center) on the image, and a correction is introduced based on the amount of displacement to recognize the positions of pads on the semiconductor chip and the tip end portions of the leads. In this arrangement, the recognized positions of the pads and the tip end portions of the leads are stored in storage means prior to wire bonding and, based on this stored data, the tip end of the bonding tool is repositioned in the bonding apparatus.

In contrast, since high accuracy is required for pad position detection, bonding apparatuses configured to keep the occurrence of position measurement errors as low as possible are becoming common with an arrangement in which the rotation center of the bonding arm has the same height as the surface of a lead frame on which a semiconductor chip for bonding is mounted, and the motion trajectory of the tip end of the bonding tool is made perpendicular to the surface of the lead frame during bonding as well as imaging means is arranged perpendicular to the surfaces of the lead frame and the semiconductor chip.

A bonding apparatus 100 according to a related art will hereinafter be described with reference to FIGS. 10 to 13. As shown in FIG. 10, the bonding apparatus 100 according to the related art includes: a bonding stage 113 for holding thereon a lead frame 112 on which a semiconductor chip 141 is mounted; a reference plane 111 parallel to the surface 114 of the bonding stage 113; a bonding arm 121 configured to be rotated by a drive motor 117 about a rotation center 115 that lies in the reference plane 111 and to move a capillary 123 attached at a tip end thereof in a direction toward and away from the lead frame 112, which is held on the bonding stage 113 with the surface thereof having the same height as the reference plane 111, and the semiconductor chip 141 that is mounted on the lead frame 112; and an imaging device 125 for imaging the surfaces of the semiconductor chip 141 and the lead frame 112 to detect the positions of pads provided on the semiconductor chip 141 or leads provided on the lead frame 112. In FIG. 10, the bonding stage surface 114 and the reference plane 111 are in parallel with the XY plane, a horizontal plane, with the Z direction in the figure pointing upward with respect to the bonding apparatus 100. The rotation center 115 of the bonding arm 121 is shown as an intersection point between the reference plane 111 and a centerline 132 extending in the Z direction.

The rotation center 115 of the bonding arm 121 is provided at the same height as the reference plane 111 and the surface of the lead frame 112 above the bonding stage surface 114. Consequently, the tip end of the capillary 123 moves on a motion trajectory 135, a circular arc that intersects perpendicularly with the reference plane 111 and the surface of the lead frame 112. The imaging device 125 is provided in such a manner that an optical axis 151 thereof is made perpendicular to the reference plane 111. It is noted that the optical axis 151 runs through the center of the imaging device 125 to serve as a reference when detecting the positions of pads and/or leads. The imaging device 125 is also provided with a predetermined spacing from the capillary 123 and the bonding arm 121 in the X direction in FIG. 10.

FIG. 11 illustrates the plane of rotation of the bonding arm 121 and the plane including the optical axis 151 of the imaging device, which are arranged with a predetermined spacing in the X direction, on the same plane. As shown in FIG. 11, the optical axis 151, which serves as a measurement line of the imaging device 125, is a straight line perpendicular to the reference plane 111, while the motion trajectory 135 of the tip end of the capillary 123 is a circular arc that intersects perpendicularly with the reference plane 111 at point A. Therefore, the optical axis 151 and the motion trajectory 135 become misaligned in the Y direction with increasing distance from the reference plane 111. This misalignment in the Y direction then emerges as a Y-direction position measurement error by the imaging device 125. The amount of this misalignment in the Y direction between the optical axis 151 and the motion trajectory 135 can be calculated using the radius $r_1$ of the bonding arm 121 and the position of the rotation center 115. As indicated by the curve "t" in FIG. 13, the amount of misalignment in the Y direction increases against the distance from the reference plane 111 as the tip end of the capillary 123 moves away from the reference plane 111, but if the rotation center 115 of the bonding arm 121 lies in the same plane as the reference plane 111, the amount of misalignment in the Y direction is 2 μm to 3 μm at the largest against the distance from the reference plane 111.

In the bonding apparatus 100 illustrated in FIGS. 10 and 11, the bonding arm 121 is moved downward, prior to bonding operations, such that the tip end of the capillary 123 comes into contact with the surface 140a of the semiconductor chip 140 that is mounted on the lead frame 112 and, with the downward movement being halted, the angle of rotation of the bonding arm 121 is measured to determine the height $H_0$ of the surface 140a of the semiconductor chip 140 for bonding and calculate the Y-direction position of point $C_0$ on the motion trajectory 135 at the height $H_0$, thereby to obtain the difference between the Y-direction position of $C_0$ and the Y-direction position of point $B_0$ on the optical axis 151 at the height $H_0$ as the amount of misalignment $\Delta_0$ in the Y direction between the optical axis 151 and the motion trajectory 135 of the tip end of the capillary 123. The amount of misalignment $\Delta_0$ in the Y direction is then set as a Y-direction offset for values measured by the imaging device 125 to correct the amount of misalignment in the Y direction between the straight optical axis 151 and the circular motion trajectory 135.

The height of the surface of the semiconductor chip for bonding from the reference plane 111 is known to vary within the range of several tens of micrometers due to a variation in the thickness of the lead frame 112 on which the semiconductor chip is mounted or the joint thickness when the semiconductor chip is mounted on the lead frame 112. For example, as shown in FIG. 11, when the height of the surface 141a of the semiconductor chip 141, which is mounted on the lead frame 112, from the reference plane 111 changes from the original height $H_0$ of the surface 140a of the semiconductor chip 140 to $H_1$, the amount of misalignment in the Y direction between the optical axis 151 and the motion trajectory 135 changes from the offset amount of misalignment $\Delta_0$ in the Y direction to the difference $\Delta_1$ in the Y-direction position between points $B_1$ and $C_1$ at the height $H_1$, with a difference $d_1$ therebetween, as shown in FIG. 13. If the difference in the height between the surfaces 140a and 141a of the respective semiconductor chips 140 and 141, i.e., ($H_1 - H_0$) is several tens of micrometers, the difference $d_1$ is within the range from 0.1 μm to 0.2 μm, which has little effect on bonding accuracy.

However, in the above-described bonding apparatus according to the related art, the rotation center 115 of the bonding arm 121 is required to have the same height as the reference plane 111, as shown in FIGS. 10 and 11, to improve position measurement accuracy. This requires the rotation center 115 to be provided above the bonding stage 113 to prevent interference between the bonding arm 121 and the bonding stage 113. In this case, increasing the size of the bonding stage 113 and thereby widening the bonding area so as to support bonding for larger semiconductor chip 141 would require an increase in the length of the bonding arm 121. However, increasing the length of the bonding arm 121 would also result in an increase in the weight and therefore the moment of inertia thereof, suffering from a problem in that the bonding cannot be sped up.

Hence, it can be considered, as shown in FIG. 12, to provide the rotation center 215 of the bonding arm 221 above the reference plane 211. FIG. 12 illustrates the plane of rotation of the bonding arm 221 and the plane including the optical axis 251 of the imaging device, which are arranged with a predetermined spacing in the X direction, on the same plane, as is the case in FIG. 11. In this case, the motion trajectory 235 of the tip end of the capillary 223 is a circular arc with a radius $r_2$ centering on the rotation center 215 above the reference plane 211, the circular arc intersecting with the reference plane 211 at point A not perpendicularly but obliquely, as shown in FIG. 12. For this reason, the amount of misalignment in the Y direction between the optical axis 251 and the motion trajectory 235 against the height from the reference plane 211 becomes much larger compared to the case shown in FIG. 11 where the motion trajectory 135 intersects perpendicularly with the reference plane 111. The amount of this misalignment in the Y direction can also be calculated using the radius $r_2$ of the bonding arm 221 and the position of the rotation center 215, as indicated by the curve "u" in FIG. 13.

As is the case in the bonding apparatus 100 described with reference to FIGS. 10 and 11, also in the bonding apparatus 200 illustrated in FIG. 12, the bonding arm 221 is moved downward, prior to bonding operations, such that the tip end of the capillary 223 comes into contact with the surface 240a of the semiconductor chip 240 that is mounted on the lead frame 212 and, with the downward movement being halted, the angle of rotation of the bonding arm 221 is measured to determine the height $H_0$ of the surface 240a of the semiconductor chip 240 for bonding and calculate the Y-direction position of point $C'_0$ on the motion trajectory 235 at the height $H_0$, thereby to obtain the difference between the position of $C'_0$ and the Y-direction position of point $B'_0$ on the optical axis 251 at the height $H_0$ as the amount of misalignment $\Delta'_0$ in the Y direction between the optical axis 251 and the motion trajectory 235 of the tip end of the capillary 223. The amount of misalignment $\Delta'_0$ in the Y direction is then set as a Y-direction offset for values measured by the imaging device 225 to correct the amount of misalignment in the Y direction between the straight optical axis 251 and the circular motion trajectory 235.

Whereas, as shown in FIG. 12, when the height of the surface 241a of the semiconductor chip 241, which is mounted on the lead frame 212, from the reference plane 211 changes from the original height $H_0$ of the surface 240a of the semiconductor chip 240 to $H_1$, the amount of misalignment in the Y direction between the optical axis 251 and the motion trajectory 235 changes from the offset amount of misalignment $\Delta'_0$ in the Y direction to the difference $\Delta'_1$ in the Y-direction position between points $C'_1$ and $B'_1$, with a difference $d'_1$ therebetween greater than $d_1$ above, as shown in FIG. 13. If the difference in the height between the surfaces 240a and 241a of the respective semiconductor chips 240 and 241, i.e., ($H_1 - H_0$) is several tens of micrometers, the difference $d'_1$ reaches as high as 6 μm to 7 μm, which is a non-negligible error in bonding accuracy. This further constitutes a major bonding problem if the variation in the height of semiconductor chips is large as in, for example, multi-layer semiconductors in common use recently.

In order to address this problem, there has been proposed a method in which a bonding arm is suspended by a link so that a virtual point of rotation lies on the surface 214 of the bonding stage (see Japanese Patent No. 3683801, for example). However, link-based arrangements of this type generally have a complex structure and large weight, with a possibility of falling of foreign objects from the structures.

BRIEF SUMMARY OF THE INVENTION

It is an object of the present invention to provide a high-speed and high-accuracy bonding apparatus having a wide bonding area with a simple mechanism.

The present invention is directed to a bonding apparatus including: a reference plane lying along a surface of a bonding stage for holding a bonding target thereon; a bonding arm configured to be rotated about a rotation center that is arranged separately from the reference plane and to move a bonding tool attached at a tip end thereof obliquely toward and away from the reference plane; and optical position detection means for optically detecting a bonding position on the bonding target, in which an angle between an optical axis heading for the optical position detection means from the reference plane and the reference plane is approximately equal to an angle between a motion trajectory of a tip end of the bonding tool and the reference plane.

The bonding apparatus according to the present invention can preferably further include bonding stage height adjustment means for adjusting the height of the surface of the bonding stage such that the reference plane is positioned between a surface of the bonding target farthest from the surface of the bonding stage and another surface of the bonding target closest to the surface of the bonding stage. The bonding apparatus can preferably be arranged such that the bonding target is a semiconductor chip mounted on a substrate, and that the bonding stage height adjustment means is configured to adjust the height of the surface of the bonding stage such that the reference plane is positioned between a face side of the chip on which pads are provided and a reverse side of the chip opposite to the face side.

The bonding apparatus according to the present invention can preferably be arranged such that the optical position detection means is configured to include an imaging lens and an imaging element, and that an imaging plane of the imaging element is arranged to include a line of intersection between the reference plane and a principal plane of the imaging lens. The bonding apparatus can preferably further include a bonding head having the bonding arm attached thereto and slidable in a direction along the surface of the bonding stage, in which the optical position detection means is attached to the bonding head in such a manner that the optical axis thereof is included in a plane of rotation of the bonding arm.

The present invention is also directed to a bonding stage height adjustment method for a bonding apparatus including: a reference plane lying along a surface of a bonding stage for holding a bonding target thereon; a bonding arm configured to be rotated about a rotation center that is arranged separately from the reference plane and to move a bonding tool attached at a tip end thereof obliquely toward and away from the reference plane; optical position detection means for optically detecting a bonding position on the bonding target; and bonding stage height adjustment means for adjusting the height of the surface of the bonding stage, in which an angle of an optical axis heading for the optical position detection means from the reference plane and the reference plane is approximately equal to an angle between a motion trajectory of a tip end of the bonding tool and the reference plane, the method including using the bonding stage height adjustment means to adjust the height of the surface of the bonding stage such that the reference plane is positioned between a surface of the bonding target farthest from the surface of the bonding stage and another surface of the bonding target closest to the surface of the bonding stage.

The bonding stage height adjustment method according to the present invention can preferably be arranged such that the bonding target is a semiconductor chip mounted on a substrate, and that the bonding stage height adjustment means is configured to adjust the height of the surface of the bonding stage such that the reference plane is positioned between a face side of the chip on which pads are provided and a reverse side of the chip opposite to the face side.

The present invention offers the advantage of providing a high-speed and high-accuracy bonding apparatus having a wide bonding area with a simple mechanism.

BRIEF DESCRIPTION OF THE SEVERAL VIEWS OF THE DRAWINGS

Exemplary embodiments of the present invention will be described in detail based on the following figures, wherein:

FIG. 6 illustrates arrangements of a motion trajectory of a capillary and an optical axis of an imaging device in a bonding apparatus according to another exemplary embodiment of the present invention;

DETAILED DESCRIPTION OF THE INVENTION

Figure 1:
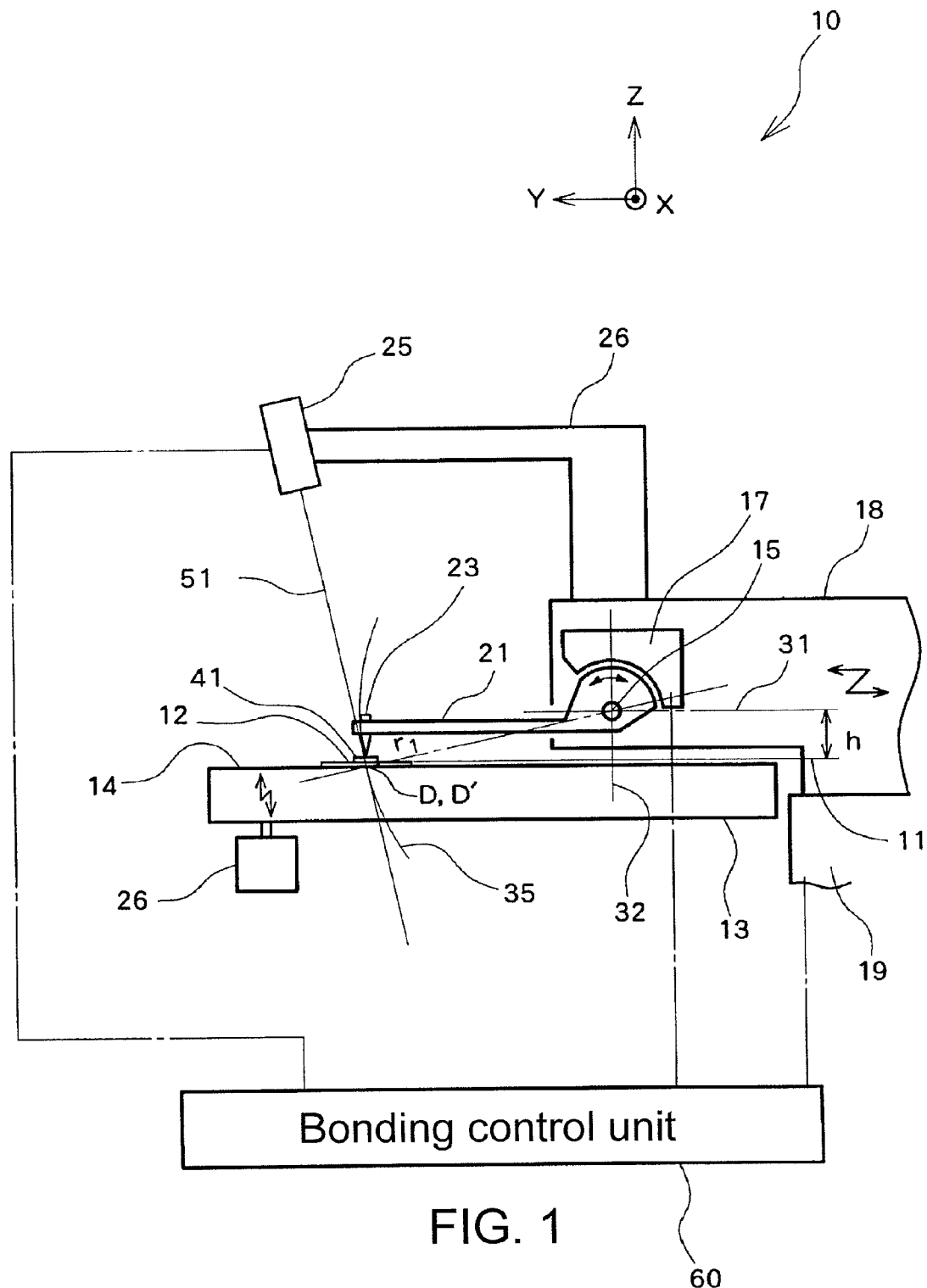
FIG. 1 illustrates a bonding apparatus according to an exemplary embodiment of the present invention.

Exemplary embodiments of the present invention will hereinafter be described in detail with reference to the accompanying drawings. As shown in FIG. 1, a bonding apparatus 10 according to an exemplary embodiment includes: a bonding stage 13 for holding thereon a lead frame 12 on which a semiconductor chip 41 is mounted; a reference plane 11 lying along the surface of the bonding stage 13; a bonding arm 21 configured to be rotated by a drive motor 17 about a rotation center 15 and to move a capillary 23 attached at a tip end thereof to serve as a bonding tool obliquely toward and away from the lead frame 12 that is held on the bonding stage 13 and/or the semiconductor chip 41 that is stacked and mounted on the lead frame 12; and an imaging device 25 serving as optical position detection means for imaging the surfaces of the lead frame 12 and/or the semiconductor chip 41 to optically detect the positions of leads provided on the lead frame 12 and/or pads provided on the semiconductor chip 41.

As shown in FIG. 1, the reference plane 11 is in parallel with the XY plane, a horizontal plane, with the Z direction in the figure pointing upward with respect to the bonding apparatus 10. The rotation center 15 of the bonding arm 21 is positioned above the reference plane 11 and shown as an intersection point between a centerline 31 extending in parallel with the reference plane 11 and a centerline 32 extending in the Z direction. The rotation center 15 of the bonding arm 21 is separated from the reference plane 11 by a height "h" in the Z direction as well as arranged over the bonding stage surface 14 also separately from the surfaces of the semiconductor chip 41, which is a bonding target, and the lead frame 12. The tip end of the capillary 23 is configured to move on a motion trajectory 35, which is a circular arc with a radius $r_1$ centering on the rotation center 15.

The motion trajectory 35 of the tip end of the capillary 23 is a circular arc including a first portion above the surface of the semiconductor chip 41 on which the tip end of the capillary 23 actually moves and a second portion obtained by extending the first portion toward the bonding stage 13. The motion trajectory 35 has an intersection point D with the reference plane 11. Since the rotation center 15 is separated above from the reference plane 11 by the height "h", the circular motion trajectory 35 intersects obliquely with the reference plane 11 at an angle.

The bonding stage 13 is connected with an actuator 26 serving as bonding stage height adjustment means, whereby the height of the surface 14 can be adjusted in the Z direction. As shown in FIG. 1, in the exemplary embodiment, the height of the surface 14 of the bonding stage 13 is adjusted such that the surface of the lead frame 12 has the same height as the reference plane 11. Also, the drive motor 17, which is configured to drive the bonding arm 21 rotationally about the rotation center 15, is attached to a bonding head 18. The semiconductor chip 41 and the lead frame 12 are bonding targets, and the positions of leads and pads are bonding positions, respectively.

As shown in FIG. 1, the imaging device 25 is arranged in an inclined manner with respect to the reference plane 11 such that the angle of an optical axis 51, which serves as a central axis of the imaging device 25 as well as a reference when detecting the positions of pads and leads, with respect to the reference plane 11 is made equal to the angle between the motion trajectory 35 of the tip end of the capillary 23 and the reference plane 11. The optical axis 51 of the imaging device 25 intersects with the reference plane 11 at an intersection point D' that lies in the reference plane 11 at the same Y-direction position as the intersection point D between the motion trajectory 35 and the reference plane 11 but separated from the point D by a distance L in the X direction.

The imaging device 25, drive motor 17, and XY table 19 are connected to a bonding control unit 60 and configured to be driven by a command from the bonding control unit 60. The bonding control unit 60 is a computer including a CPU and a storage unit. It is noted that in FIG. 1, alternate long and short dash lines connecting the imaging device 25, drive motor 17, and XY table 19 to the bonding control unit 60 indicate signal lines.

Figure 2:
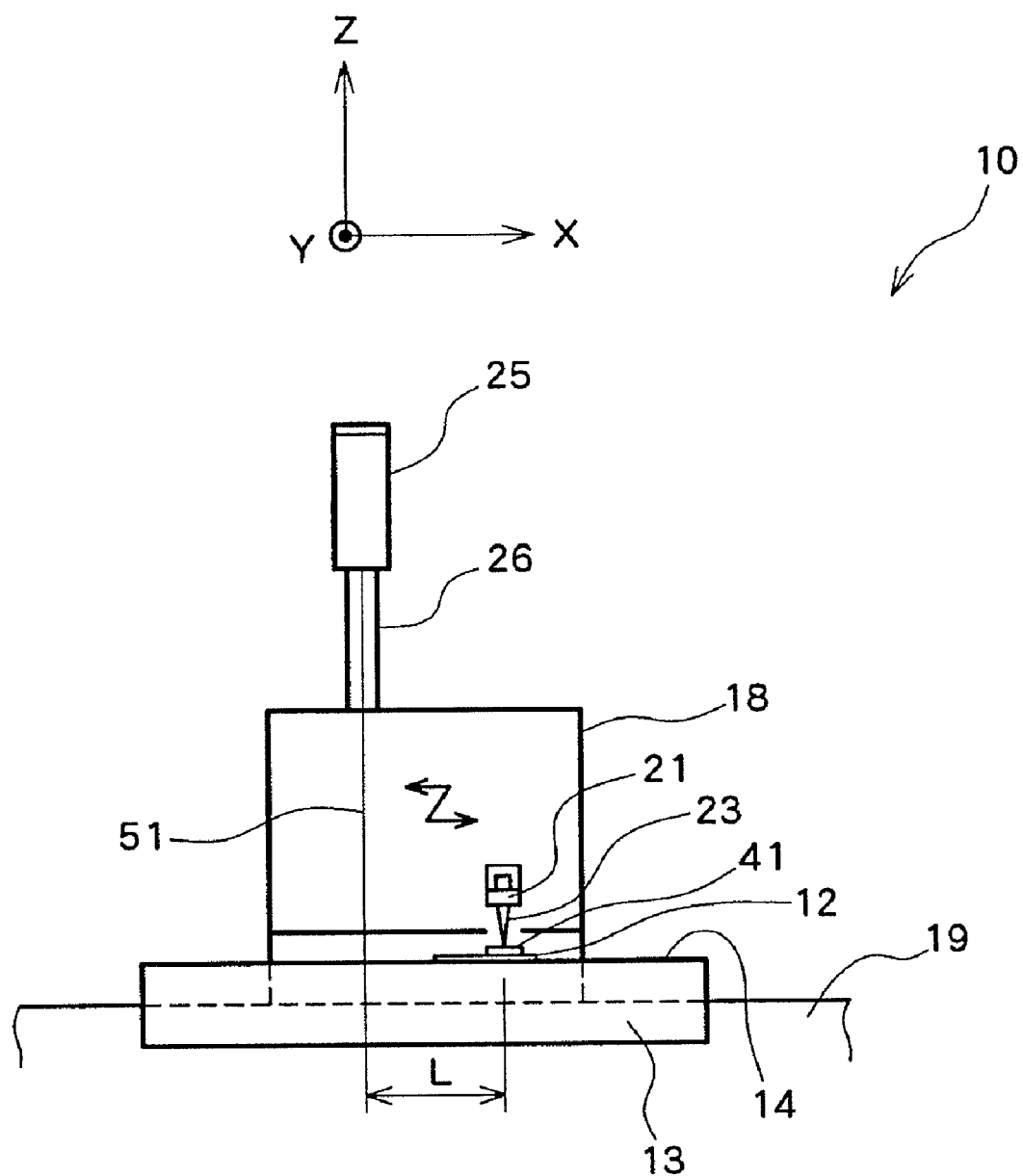
FIG. 2 is a side view of the bonding apparatus illustrated in FIG. 1 when viewed from the side of a bonding arm.

As shown in FIG. 2, the imaging device 25 is attached to the bonding head 18 in such a manner that the optical axis 51 is separated from the center of the bonding arm 21 and the capillary 23 by a distance L in the X direction. Since the bonding head 18 is configured to be movable in the X and Y directions along the surface of the XY table 19, the imaging device 25 moves in the X and Y directions together with the bonding arm 21 and the capillary 23 while maintaining the distance L in the X direction.

Figure 3:
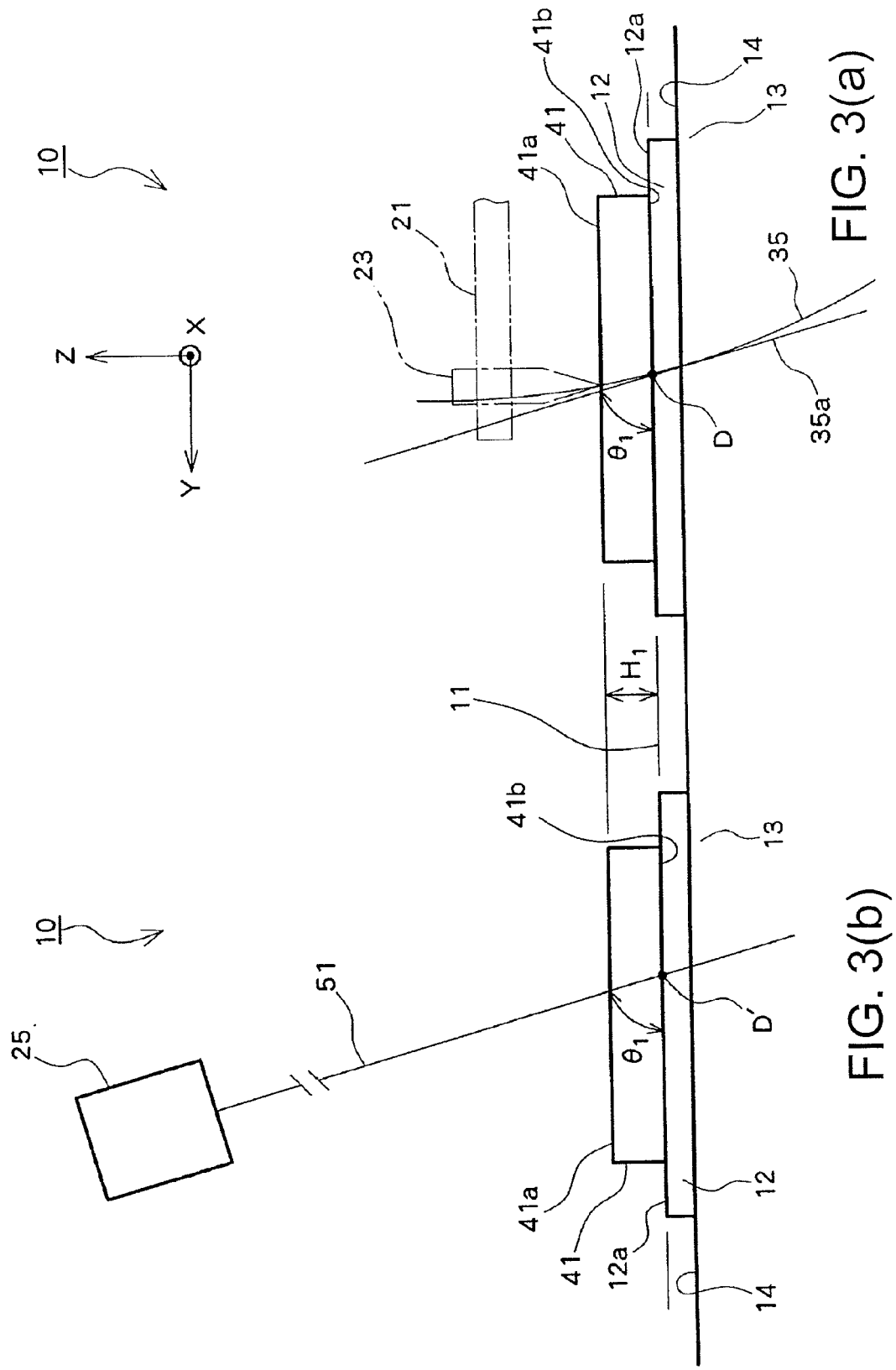
FIG. 3 illustrates arrangements of a motion trajectory of a capillary and an optical axis of an imaging device in the bonding apparatus according to an exemplary embodiment of the present invention.

FIG. 3(a) illustrates a plane of rotation of the bonding arm 21, that is, a plane on which the tip end of the capillary 23 moves. Since the rotation center 15 is separated from the reference plane 11 by a height "h" in the Z direction, as shown in FIG. 1, the motion trajectory 35 has an angle $\theta_1$ with respect to the reference plane 11 at the intersection point D. In FIG. 3(a), an auxiliary line 35a is a tangent to the motion trajectory 35 at the intersection point D, and $\theta_1$ is an angle between the auxiliary line 35a and the reference plane 11.

FIG. 3(b) illustrates a plane including the optical axis 51 that is separated by a distance L in the X direction from the plane shown in FIG. 3(a) on which the tip end of the capillary 23 moves. Both the intersection point D' between the optical axis 51 and the reference plane 11 and the intersection point D between the motion trajectory 35 and the bonding surface lie in the reference plane 11 at the same Y-direction position. As shown in FIG. 3(b), the imaging device 25 is arranged in such a manner that the optical axis 51 has an angle $\theta_1$ with respect to the reference plane 11, the same as the inclined angle of the motion trajectory 35 with respect to the reference plane 11. Therefore, the auxiliary line 35a shown in FIG. 3(a), which is a tangent to the motion trajectory 35, is in parallel with the optical axis 51 shown in FIG. 3(b).

Figure 5:
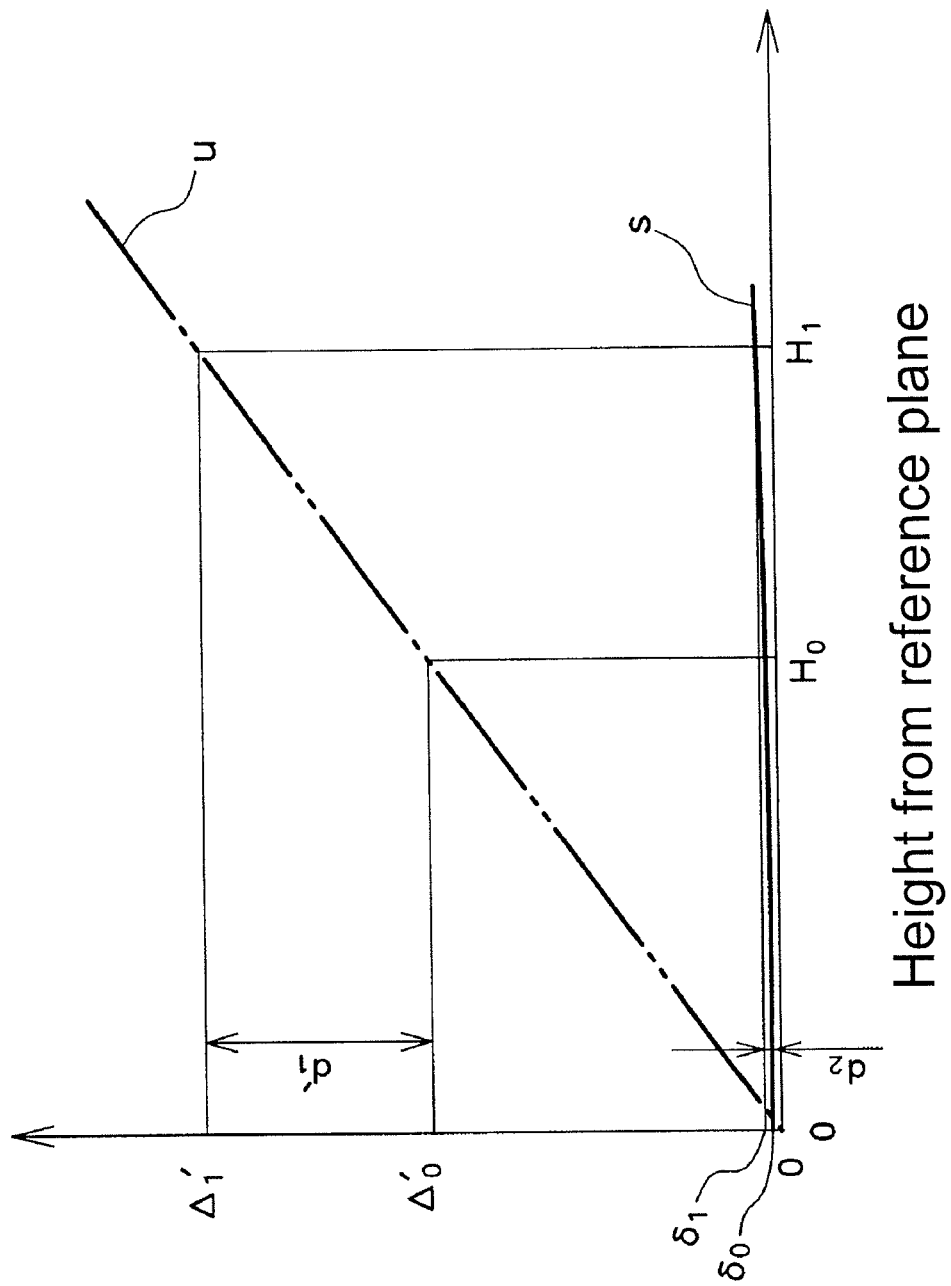
FIG. 5 is a graph illustrating the relationship between the height from a reference plane and the amount of misalignment in the Y direction between the motion trajectory of the tip end of the capillary and the optical axis in the bonding apparatus according to an exemplary embodiment of the present invention.
Figure 12:
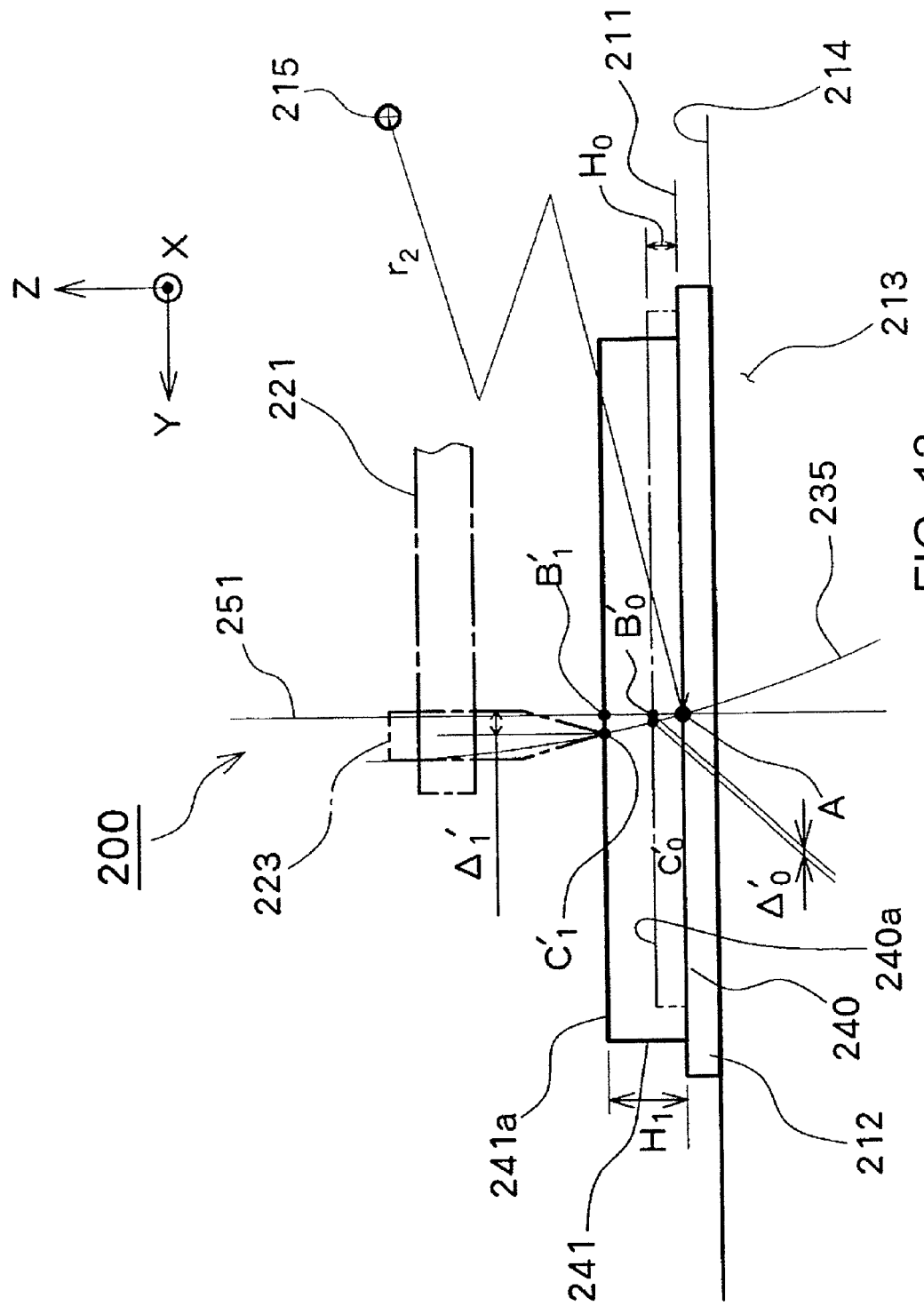
FIG. 12 illustrates superimposed arrangements of a motion trajectory of a capillary and an optical axis of an imaging device in the bonding apparatus according to another related art.
Figure 13:
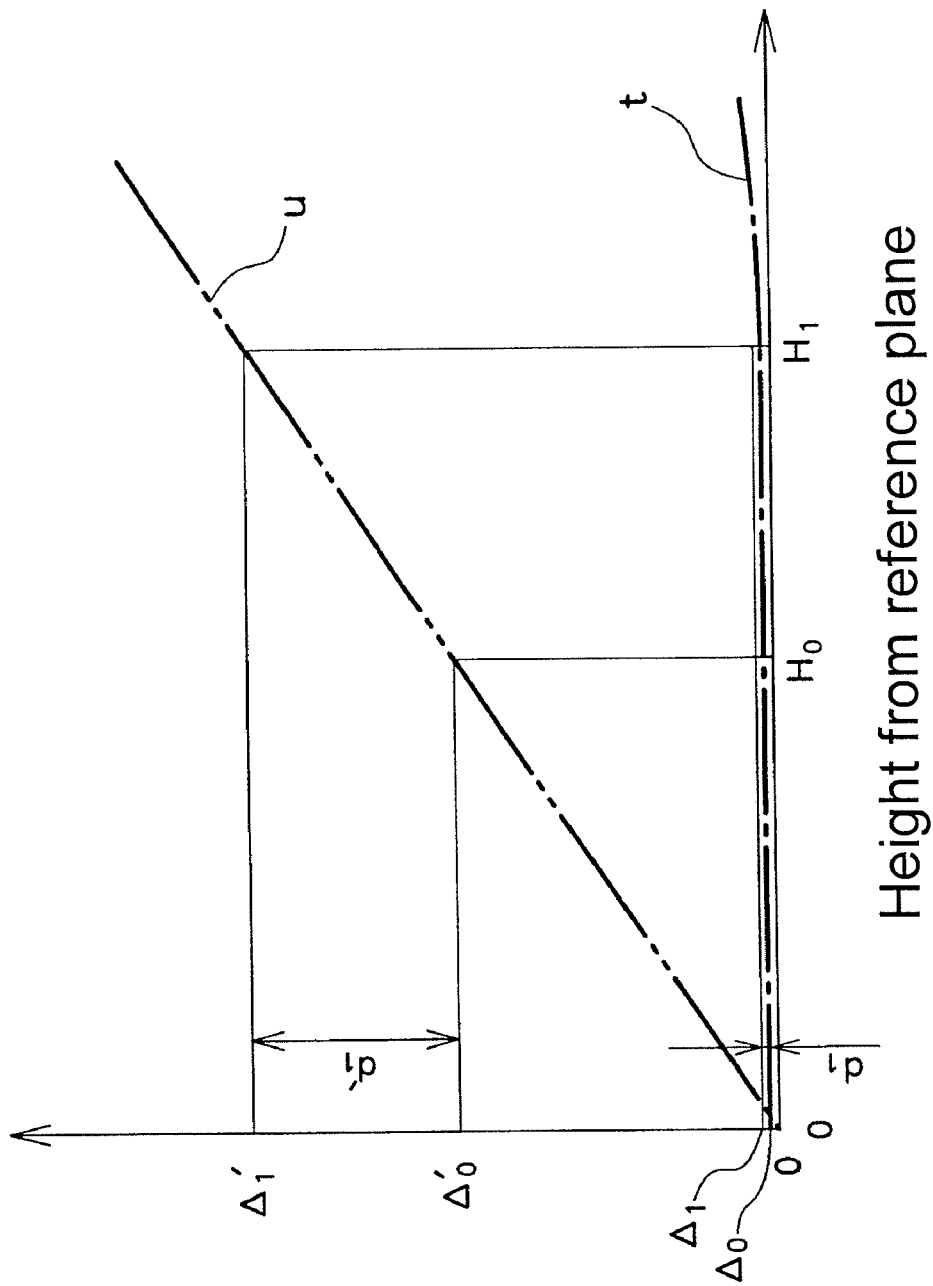
FIG. 13 is a graph illustrating the relationship between the height from a reference plane and the amount of misalignment in the Y direction between the motion trajectory of the tip end of the capillary and the optical axis in the bonding apparatuses according to the related arts.

The amount of misalignment in the Y direction between the motion trajectory 35 and the optical axis 51 shown in FIG. 3(a) is converted through the imaging device 25 into a Y-direction positional difference between detection data of the positions of pads on the surface 41a of the semiconductor chip and/or leads on the surface 12a of the lead frame 12 and the actual position of the tip end of the capillary 23. The Y-direction positional difference against the height from the reference plane 11 can be calculated using the position of the rotation center 15 and the radius $r_1$ of the circular motion trajectory 35 shown in FIG. 1 and the angle $\theta_1$ of the optical axis 51. As indicated by the curve "s" in FIG. 5, the Y-direction positional difference increases as the height from the reference plane 11 increases, but the magnitude is much smaller compared to the curve "u" in FIG. 5, which indicates the amount of misalignment in the Y direction between the optical axis 251 and the motion trajectory 235 in the bonding apparatus 200 in which the optical axis 251 is perpendicular to the reference plane 211 as illustrated in FIG. 12.

Figure 4:
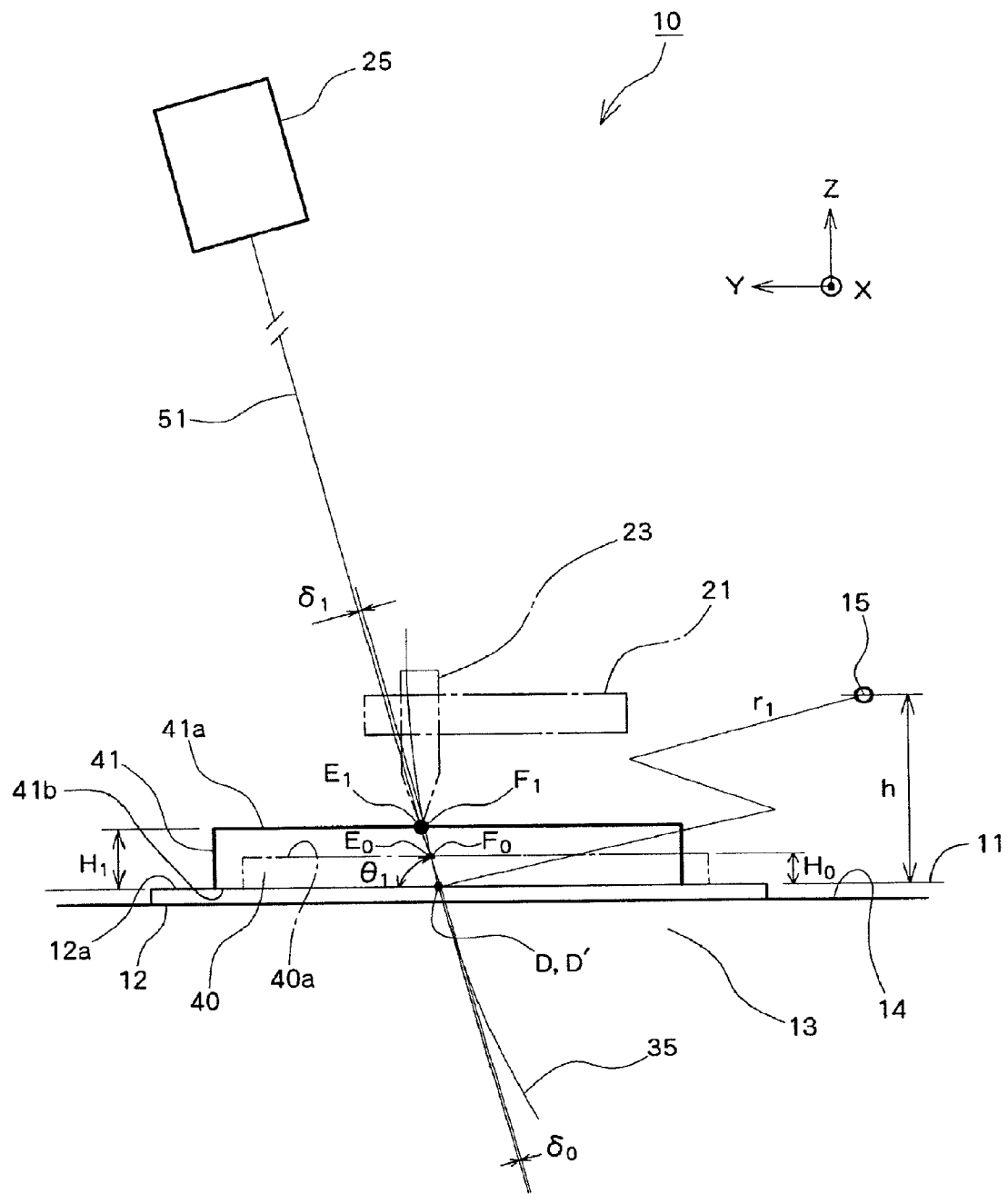
FIG. 4 illustrates superimposed arrangements of the motion trajectory of the capillary and the optical axis of the imaging device in the bonding apparatus according to an exemplary embodiment of the present invention.

The bonding operation of the thus arranged bonding apparatus 10 and the change in the amount of misalignment in the Y direction between the motion trajectory 35 of the tip end of the capillary 23 and the optical axis 51 will be described with reference to FIG. 4. FIG. 4 illustrates the plane of rotation of the bonding arm 21, that is, the plane on which the capillary 23 moves and the vertical plane including the optical axis 51 of the imaging device, which are arranged with a distance L therebetween in the X direction, superimposed on the same plane.

As shown in FIG. 4, in the bonding apparatus 10, the bonding arm 21 is moved downward, prior to bonding operations, such that the tip end of the capillary 23 comes into contact with the surface 40a of the semiconductor chip 40 that is mounted on the lead frame 12 and, with the downward movement being halted, the angle of rotation of the bonding arm 21 is measured to determine the height $H_0$ of the surface 40a of the semiconductor chip 40 for bonding from the reference plane 11 and calculate the Y-direction position of point $F_0$ on the motion trajectory 35 at the height $H_0$ using the position of the rotation center 15 and the radius $r_1$ of the circular motion trajectory 35. The Y-direction position of point $E_0$ on the optical axis 51 at the height $H_0$ is also calculated using the angle $\theta_1$ of the optical axis 51 and the height $H_0$. The difference between the positions of points $E_0$ and $F_0$ is then obtained as the amount of misalignment $\delta_0$ in the Y direction between the optical axis 51 and the motion trajectory 35 of the tip end of the capillary 23. The amount of misalignment $\delta_0$ in the Y direction is then stored in the storage unit incorporated in the bonding control unit 60 as a Y-direction offset for values measured by the imaging device 25. During the detection of the positions of pads on the surface 40a of the semiconductor chip 40 using the imaging device 25, Y-direction positions of the pads actually detected by the imaging device 25 are offset by the amount of misalignment $\delta_0$ in the Y direction to be recognized as actual Y-direction positions of the pads for bonding. The bonding control unit 60 also adds the distance L to X-direction measurement values of the pads detected by the imaging device 25 to recognize actual X-direction positions of the pads.

Even if, due to a variation in the thickness of the lead frame 12, an error in the joint thickness of the semiconductor chip, or the like, the height of the surface 41a of the semiconductor chip 41 from the reference plane 11 may have a height $H_1$ greater than that of the surface 40a of the semiconductor chip 40 to which the above-described amount of misalignment $\delta_0$ in the Y direction is set, the bonding control unit 60 uses the initially set amount of misalignment $\delta_0$ in the Y direction as a Y-direction offset to offset positions detected by the imaging device 25 with the amount of misalignment $\delta_0$ in the Y direction and thereby recognize actual Y-direction positions of the pads for bonding. As indicated by the curve "s" in FIG. 5, when the height from the reference plane 11 is $H_1$, the amount of misalignment in the Y direction between the motion trajectory 35 and the optical axis 51 becomes $\delta_1$ greater than $\delta_0$, which produces a difference between the detected Y-direction position and the Y-direction position of the motion trajectory 35 by the difference $d_2$ between $\delta_1$ and $\delta_0$. However, since the optical axis 51 of the imaging device 25 has the same inclined angle $\theta_1$ as that of the motion trajectory 35 with respect to the reference plane 11, the rate of change in the amount of misalignment in the Y direction against the height from the reference plane 11 is low as indicated by the curve "s" in FIG. 5, whereby the difference $d_2$ also takes a very small value. For example, if the difference $(H_1 - H_0)$ in the height from the reference plane 11 between the surfaces 40a and 41a of the respective semiconductor chips 40 and 41 is about 50 μm, the difference $d_2$ takes 0.1 μm to 0.2 μm, which has little effect on bonding accuracy.

In the case of bonding to leads on the surface 12a of the lead frame 12, the surface 12a of the lead frame 12 has the same height as the reference plane 11, which produces little amount of misalignment.

The exemplary embodiment offers the advantage that even if the rotation center 15 of the bonding arm 21 can be arranged separately above (in the Z direction) the bonding stage 13, the difference between the detected Y-direction positions of pads or leads and the Y-direction position of the motion trajectory 35 of the capillary 23 when there occurs a variation in the height of the surface 41a or 12a of the semiconductor chip 41, which is a bonding target, or the lead frame 12 from the reference plane 11 can be reduced to the extent of having no effect on bonding. The exemplary embodiment thus offers the advantage of performing high-accuracy bonding with a simple structure in which the optical axis 51 of the imaging device 25 is arranged in an inclined manner with respect to the reference plane 11. The exemplary embodiment also offers the advantage of covering a wider bonding area with a shorter bonding arm 21, reducing the weight of the bonding arm 21, and performing high-speed bonding because the rotation center 15 can be arranged above the bonding stage 13.

Although the exemplary embodiment describes the case where the optical axis 51 of the imaging device 25 has the same inclined angle $\theta_1$ as that of the motion trajectory 35 with respect to the reference plane 11, the angles may not be completely the same after actual assembling and installation of the apparatus. Even in this case, if the difference due to an assembly error between the angle between the motion trajectory 35 and the reference plane 11 and the angle between the optical axis 51 and the reference plane 11 is within the range from about 0.1 degrees to 0.2 degrees, a positional accuracy that has no effect on bonding can be ensured even if there may be a Y-direction positional difference due to the error.

Although the exemplary embodiment describes the case where the reference plane 11 has the same height as the surface 12a of the lead frame 12, the reference plane 11 is only required to lie between the surface 41a of the semiconductor chip 41, which is a bonding target farthest from the bonding stage surface 14, and the surface 12a of the lead frame 12, which is a bonding target closest to the bonding stage surface 14. For example, the height of the surface 14 of the bonding stage 13 can be adjusted to have the same height as the face side 41a of the semiconductor chip 41 on which pads are provided or the reverse side 41b opposite to the face side 41a, or to be positioned between the face side 41a and the reverse side 41b. Although the embodiment describes the case where the height of the surface 14 of the bonding stage 13 is adjusted by the actuator 26, another method such as changing the thickness of heat block comas of the bonding stage 13 can be employed to adjust the height of the surface 14.

Further, the bonding apparatus 10 according to the exemplary embodiment can be a wire-bonding apparatus or a bump-bonding apparatus.

Another exemplary embodiment will next be described with reference to FIG. 6. Identical components described with reference to FIGS. 1 to 5 are designated by the same reference numerals to omit the descriptions thereof. FIG. 6(a) illustrates a plane of rotation of the bonding arm 21, that is, a plane on which the tip end of the capillary 23 moves. FIG. 6(b) illustrates a plane including the optical axis 51 that is separated by a distance L in the X direction from the plane shown in FIG. 6(a) on which the tip end of the capillary 23 moves. As shown in FIG. 6, two first- and second-layer semiconductor chips 42 and 43 are stacked and mounted on the lead frame 12. The surface 12a of the lead frame 12 has leads thereon, and the surfaces 42a and 43a of the respective first- and second-layer semiconductor chips 42 and 43 each have pads thereon. Also, the lead frame 12 and the first- and second-layer semiconductor chips 42 and 43 are bonding targets, and the surfaces 12a, 42a, and 43a are bonding target surfaces. In this exemplary embodiment, the height of the surface 14 of the bonding stage 13 is adjusted such that the reference plane 11 lies within the thickness of the first-layer semiconductor chip 42. The reference plane 11 lies between the surface 43a of the second-layer semiconductor chip 43, which is a bonding target surface farthest from the bonding stage surface 14, and the surface 12a of the lead frame 12, which is a bonding target surface closest to the bonding stage surface 14, and more particularly, between the face side 42a of the first-layer semiconductor chip 42 on which pads are provided and the reverse side 42b opposite to the face side 42a. The height of the surface 14 of the bonding stage 13 can also be adjusted such that the reference plane 11 lies between the face side 43a of the second-layer semiconductor chip 43 on which pads are provided and the reverse side 43b opposite to the face side 43a.

As shown in FIG. 6(a), the motion trajectory 35 of the tip end of the capillary 23 intersects obliquely with the reference plane 11 at an intersection point G, and the angle between the motion trajectory 35 and the reference plane 11 is $\theta_2$. Also, as shown in FIG. 6(b), the intersection point G' between the optical axis 51 and the reference plane 11 lies in the reference plane 11 at the same Y-direction position as the intersection point G between the motion trajectory 35 and the reference plane 11, which also lies in the reference plane 11. The imaging device 25 is arranged in such a manner that the optical axis 51 has an angle $\theta_2$ with respect to the reference plane 11, the same as the inclined angle of the motion trajectory 35 with respect to the reference plane 11. Therefore, the auxiliary line 35a shown in FIG. 6(a), which is a tangent to the motion trajectory 35, is in parallel with the optical axis 51 shown in FIG. 6(b).

In the exemplary embodiment, since the reference plane 11 lies between the surface 12a of the lead frame 12 and the surface 43a of the second-layer semiconductor chip 43, the distances between the surfaces 12a, 42a, and 43a and the reference plane 11 are small, whereby the amount of misalignment in the Y direction between the motion trajectory 35 and the optical axis 51 can be suppressed. This offers the advantage that even if the heights of the surfaces 12a, 42a, and 43a from the reference plane 11 are varied, the Y-direction positional difference can be made smaller, which allows a high bonding accuracy to be maintained even in the case of bonding to tall multi-layer semiconductor devices.

Figure 7A:
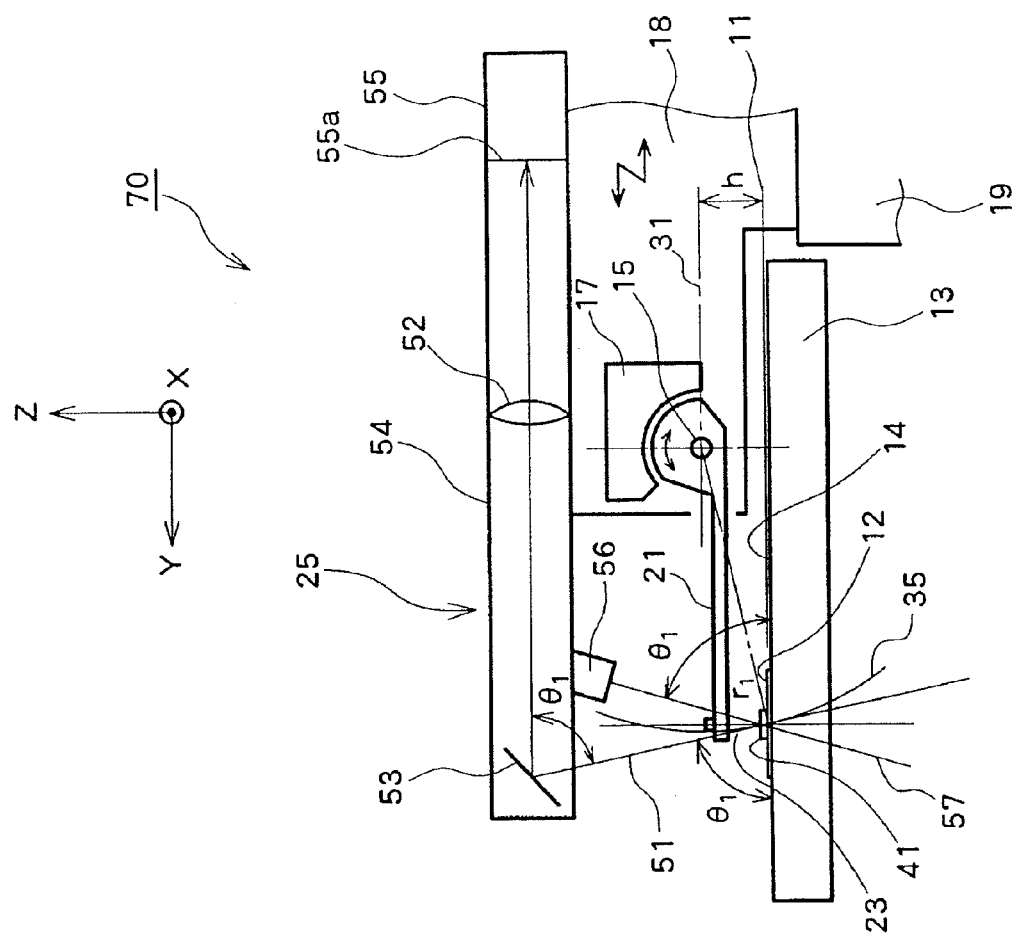
FIG. 7 illustrates a bonding apparatus according to still another exemplary embodiment of the present invention.
Figure 7B:
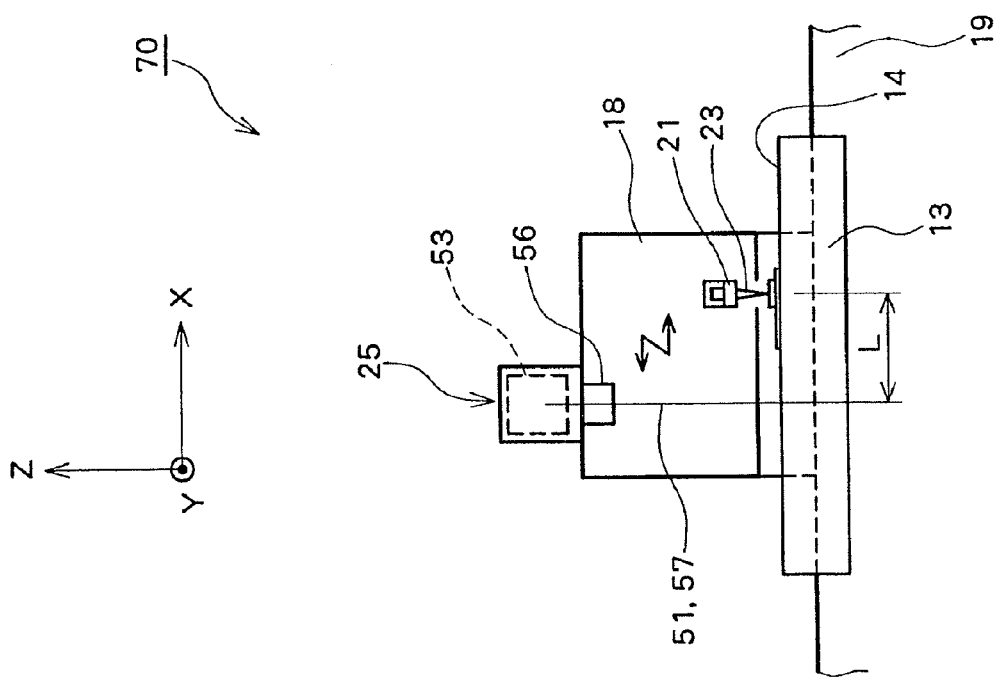

Still another exemplary embodiment of the present invention will next be described with reference to FIG. 7. Components identical to those in the embodiments described with reference to FIGS. 1 to 6 are designated by the same reference numerals to omit the descriptions thereof. As shown in FIG. 7, the bonding apparatus 70 according to the exemplary embodiment includes: a mirror 53 for converting the optical path of the optical axis 51 from the semiconductor chip 41; a horizontally arranged lens tube 54; an imaging lens 52 arranged inside the lens tube 54; an imaging element 55 for converting an image provided on an imaging plane 55a through the imaging lens 52 into an electrical signal; and a light source 56 for illuminating the semiconductor chip 41 as an imaging target. The optical path 57 from the light source 56 is arranged in an inclined manner on the opposite side of the optical axis 51 with respect to the center of the capillary 23 at an angle $\theta_1$ the same as that of the optical axis 51 with respect to the reference plane 11 so that light from the light source 56 can be reflected at the surface of the semiconductor chip 41 and then travel along the optical axis 51. The light source 56 can be attached to the lens tube 54 or the bonding head 18 using an attachment arm or the like. As is the case in the above-described bonding apparatus 10, the plane of rotation of the bonding arm 21 and the optical axis 51 are arranged with a distance L in the X direction therebetween.

Figure 8:
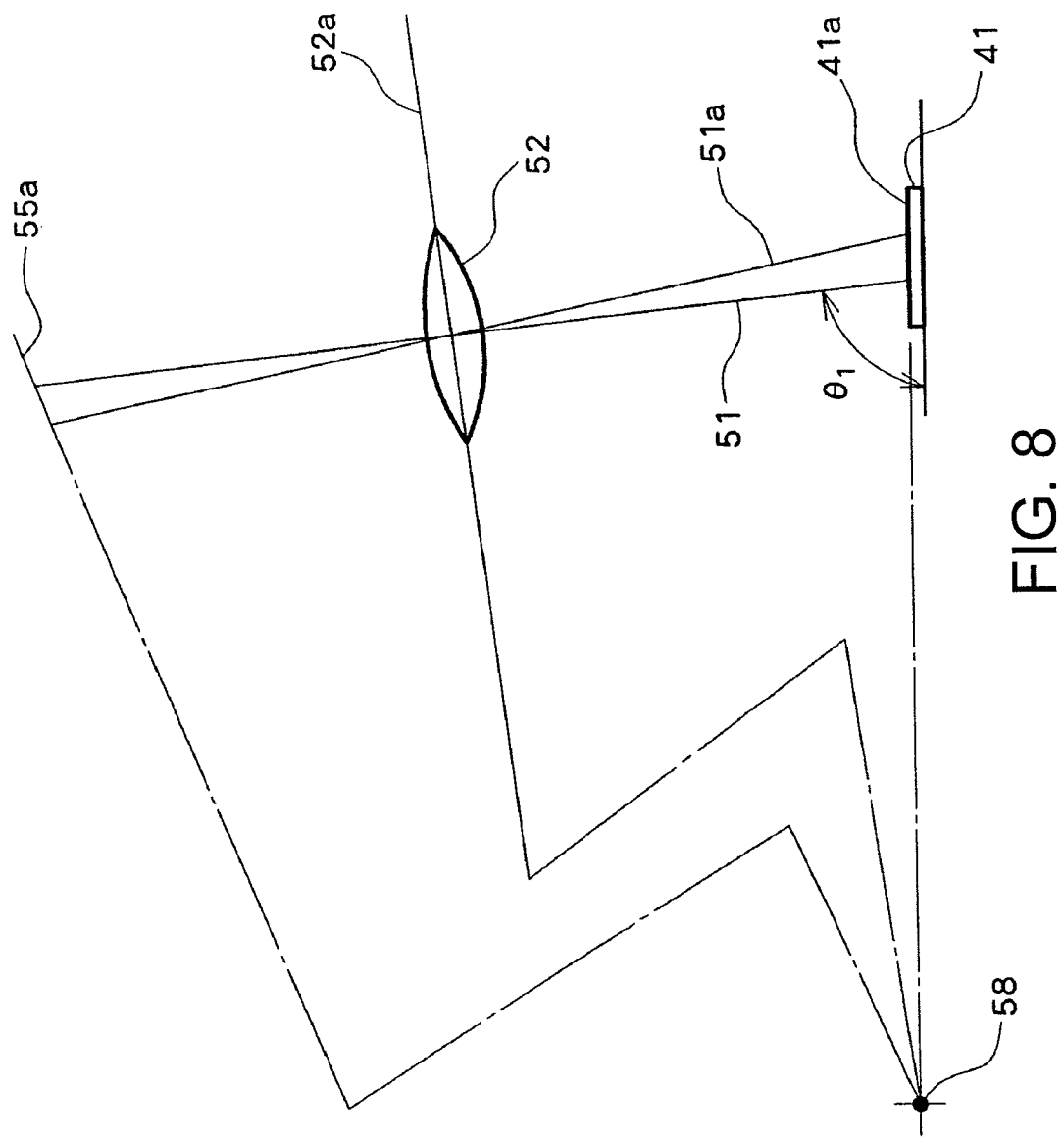
FIG. 8 illustrates an optical system of the imaging device in the bonding apparatus according to the still another exemplary embodiment of the present invention.

As shown in FIG. 8, the imaging plane 55a of the imaging element 55 is arranged to include a line of intersection 58 between the surface 41a of the semiconductor chip 41, which is a bonding target surface, and a principal plane 52a that runs through the center of the imaging lens 52. Even in the case of thus arranging the imaging plane 55a to focus on the central portion of the semiconductor chip 41 that enters the imaging plane 55a along the optical axis 51, it is also able to focus on edge portions of the semiconductor chip 41 that reach the imaging plane 55a along the optical path 51a and therefore on the entire field of view of the imaging device 25, which allows blurring of images at the edge of the field of view to be suppressed. This allows clear images to be obtained across the entire field of view of the imaging device 25, whereby the accuracy of detecting, for example, the positions of pads on the semiconductor chip 41 can be improved.

In addition to the advantages offered by the above-described exemplary embodiments, this exemplary embodiment offers the advantage that since light from the light source 56 can be reflected at the surface of the semiconductor chip 41 and then travel along the optical axis 51, the semiconductor chip 41 can be illuminated efficiently, resulting in an improvement in the position measurement accuracy of the imaging device. This also offers the advantage that since clear images can be obtained across the entire field of view of the imaging device 25, the position measurement accuracy can be further improved.

Figure 9:
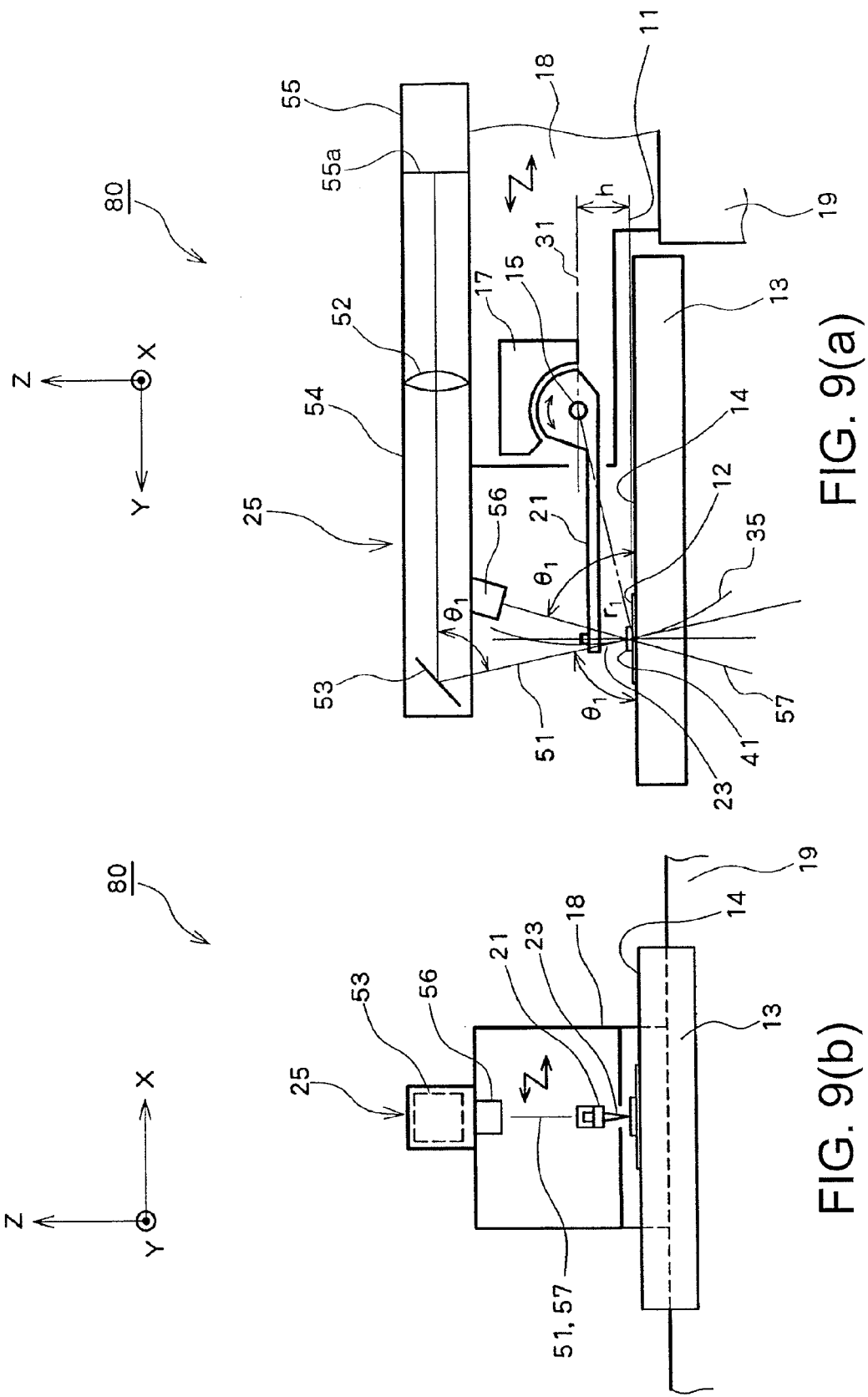
FIG. 9 illustrates a bonding apparatus according to a further exemplary embodiment of the present invention.
Figure 10:
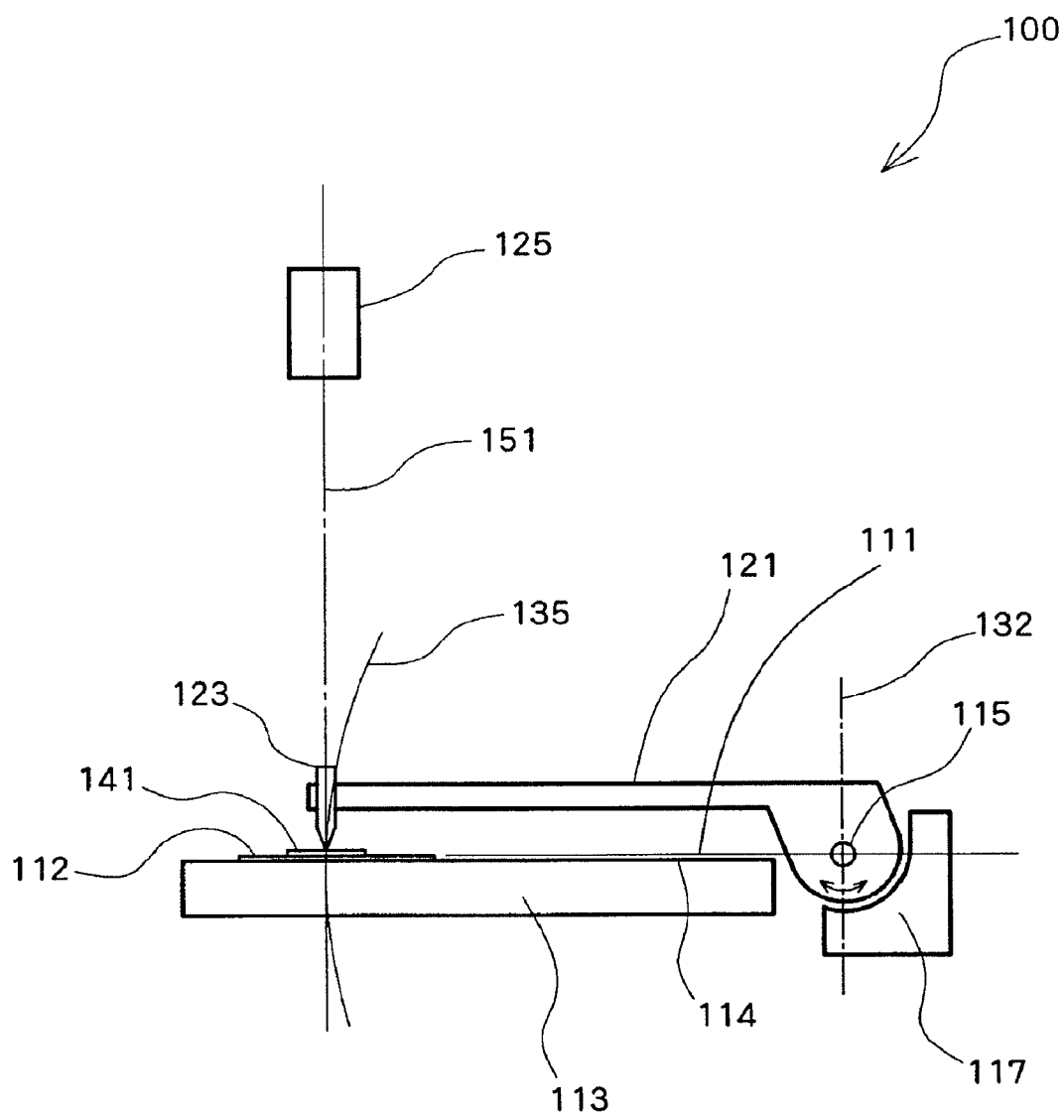
FIG. 10 illustrates a bonding apparatus according to a related art.
Figure 11:
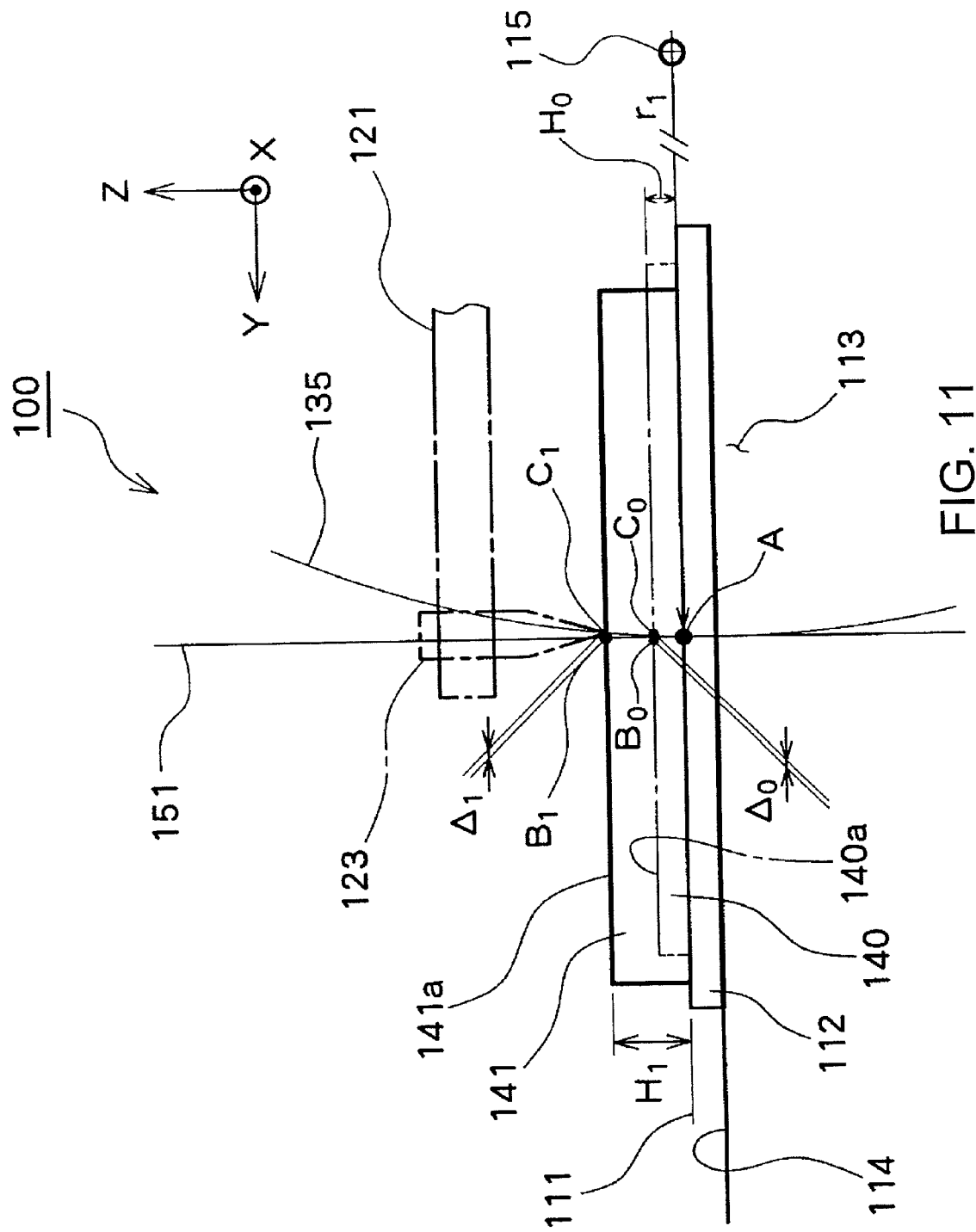
FIG. 11 illustrates superimposed arrangements of a motion trajectory of a capillary and an optical axis of an imaging device in the bonding apparatus according to the related art.

A further exemplary embodiment of the present invention will next be described with reference to FIG. 9. Components identical to those in the embodiments described with reference to FIGS. 1 to 8 are designated by the same reference numerals to omit the descriptions thereof. As shown in FIG. 9, in the bonding apparatus 80 according to the exemplary embodiment, the optical axis 51 of the imaging device 25 and the optical path 57 from the light source 56 are arranged in the plane of rotation of the bonding arm 21. Therefore, the optical axis 51 and the tip end of the capillary 23 lie in the same position in the X direction, and thus the positions of pads on the semiconductor chip 41 detected by the imaging device 25 have no offset in the X direction, which offers the advantage that the initialization of the bonding apparatus can be facilitated and the position measurement accuracy can be further improved.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

What is claimed is:

1. A bonding apparatus comprising:
a bonding stage for holding a bonding target on a surface thereof;
a reference plane lying along the surface of the bonding stage between a surface of the bonding target farthest from the surface of the bonding stage and the surface on which the bonding target is placed;
a bonding arm configured to be rotated about a rotation center that is arranged separately from the reference plane and to move a bonding tool attached at a tip end thereof toward and away from the bonding target obliquely with respect to the reference plane in the plane of rotation thereof; and
optical position detection means having an optical axis included in a plane parallel to the plane of rotation of the bonding arm and arranged in a region on the opposite side of the rotation center with respect to a circular arc including a motion trajectory of a tip end of the bonding tool, the optical position detection means being configured to optically detect a bonding position on the bonding target, wherein
an angle between the optical axis heading for the optical position detection means from the reference plane and the reference plane is equal to an angle between the motion trajectory of the tip end of the bonding tool and the reference plane.

2. The bonding apparatus according to claim 1, wherein
the bonding target is a semiconductor chip mounted on a substrate, and
the reference plane lies along the surface of the bonding stage between a surface of the semiconductor chip on which pads are provided and a surface of the substrate on which the semiconductor chip is placed.

3. The bonding apparatus according to claim 1, wherein
the optical position detection means is configured to include an imaging lens and an imaging element, and
an imaging plane of the imaging element is arranged to include a line of intersection between the reference plane and a principal plane of the imaging lens.

4. The bonding apparatus according to claim 1, further comprising a bonding head having the bonding arm attached thereto and slidable in a direction along the surface of the bonding stage, wherein
the optical position detection means is attached to the bonding head in such a manner that the optical axis thereof is included in the plane of rotation of the bonding arm.

5. A bonding stage height adjustment method comprising: preparing a bonding apparatus comprising:
a bonding stage for holding a bonding target on a surface thereof;
a bonding arm configured to be rotated about a rotation center that is arranged separately from the surface of the bonding stage and to move a bonding tool attached at a tip end thereof obliquely toward and away from a surface of the bonding target in the plane of rotation thereof;
optical position detection means having an optical axis included in a plane parallel to the plane of rotation of the bonding arm and arranged in a region on the opposite side of the rotation center with respect to a circular arc including a motion trajectory of a tip end of the bonding tool, the optical position detection means being configured to optically detect a bonding position on the bonding target;
a reference plane lying along the surface of the bonding stage, in which an angle between the optical axis heading for the optical position detection means from the reference plane and the reference plane is equal to an angle between the motion trajectory of the tip end of the bonding tool and the reference plane; and
bonding stage height adjustment means for adjusting the height of the surface of the bonding stage, and
using the bonding stage height adjustment means to adjust the height of the surface of the bonding stage such that the reference plane is positioned between a surface of the bonding target farthest from the surface of the bonding stage and the surface on which the bonding target is placed.

6. The bonding stage height adjustment method according to claim 5, wherein
the bonding target is a semiconductor chip mounted on a substrate, and
the bonding stage height adjustment means is configured to adjust the height of the surface of the bonding stage such that the reference plane is positioned between a surface of the semiconductor chip on which pads are provided and a surface of the substrate on which the semiconductor chip is placed.

* * * * *